(12) United States Patent
Jin

(10) Patent No.: US 6,412,098 B1
(45) Date of Patent: Jun. 25, 2002

(54) SCAN CELL INCLUDING A PROPAGATION DELAY AND ISOLATION ELEMENT

(75) Inventor: London Lin-Ming Jin, San Jose, CA (US)

(73) Assignee: Adaptec, Inc., Milpitas, CA (US)

(*) Notice: Subject to any disclaimer, the term of this patent is extended or adjusted under 35 U.S.C. 154(b) by 0 days.

(21) Appl. No.: 09/107,240

(22) Filed: Jun. 30, 1998

(51) Int. Cl.[7] ............................................... G06F 17/50
(52) U.S. Cl. .................................. 716/4; 716/2; 716/5
(58) Field of Search ................................. 716/4, 2, 5

(56) References Cited

U.S. PATENT DOCUMENTS

| | | | | |
|---|---|---|---|---|
| 5,490,151 A | * | 2/1996 | Feger et al. | 371/22.3 |
| 5,568,492 A | * | 10/1996 | Flint et al. | 371/22.1 |
| 5,809,037 A | * | 9/1998 | Mathewson | 371/22.1 |
| 5,983,377 A | * | 11/1999 | Knotts | 714/26 |
| 6,125,464 A | * | 9/2000 | Jin | 714/727 |
| 6,185,710 B1 | * | 2/2001 | Barnhart | 714/727 |
| 6,226,779 B1 | * | 5/2001 | Baxter et al. | 716/16 |
| 6,266,801 B1 | * | 7/2001 | Jin | 716/8 |

* cited by examiner

*Primary Examiner*—Vuthe Siek
(74) *Attorney, Agent, or Firm*—Gunnison, McKay & Hodgson, L.L.P.; Forrest Gunnison

(57) ABSTRACT

In an integrated circuit, a scan cell has a data input terminal, a data output terminal, a scan enable terminal a scan output terminal, and a clock input terminal. A multiplexer in the scan cell has a first input terminal connected to the data input terminal, a second input terminal connected to a scan input terminal, a control terminal connected to the scan enable terminal, and a multiplexer output terminal. A D-type flip-flop element in the scan cell has a data input terminal connect to the multiplexer output terminal; a clock terminal connected to the scan cell clock input terminal; and a data output terminal connected to the scan cell data output terminal. An AND gate in the scan cell has a first terminal connected to the scan enable terminal, a second terminal coupled to the data output terminal of the D-type flip-flop, and an output terminal connected to the scan output terminal.

10 Claims, 4 Drawing Sheets

SCAN CELL INCLUDING A PROPAGATION DELAY AND ISOLATION ELEMENT

BACKGROUND OF THE INVENTION

1. Field of the Invention

This invention relates generally to on-chip testing circuitry for integrated circuits, and more particularly to scan cells utilized in scan testing of integrated circuits.

2. Description of Related Art

To enhance the testability of application specific integrated circuits (ASICs) and to achieve higher fault coverage, a common industry practice is to include scan cells within the integrated circuit that are typically interconnected to form scan chains. While the scan cells permit scan testing, each scan cell requires a finite area on a die and introduces a timing impact on the performance of the integrated circuit. Consequently, the scan cell most commonly used is a muxed-scan cell, which has a small area requirement.

FIG. 1 illustrated a portion of an integrated circuit 100 that includes a plurality of logic blocks 120-A to 120-D and a portion of a scan chain that includes muxed-scan cell 101-A, and muxed-scan cell 101-B. The functions performed by the plurality of logic blocks 120-A to 120-D and the interconnection of logic blocks 120-A to 120-D are not needed to understand the operation of the muxed-scan cells and so are not considered further.

Muxed-scan cell 101-A typically is used to replace a D-type flip-flop. Hence, data output line 110 is connected to data input terminal DI of muxed-scan cell 101-A and data output terminal DQ is connected to logic block 120-A by data input line 117 that provides an input signal to logic block 120-A. Data output terminal DQ of muxed-scan cell 101-A is also connected to scan input terminal SI of next muxed-scan cell 101-B in the scan chain by scan input line 116. Thus, the signal on output terminal DQ of muxed-scan cell drives both lines 116 and 117. Data input terminal DI of muxed-scan cell 101-B is connected to a data output line of logic block 120-A.

A clock line 112 is connected to clock terminal CLK of muxed-scan cell 101-A. The clock signal on clock line 112 is provided to clock terminal CLK of muxed-scan cell 101-B by clock line 118. Notice that in this example, the layout of logic blocks 120-A to 120-D requires a somewhat circuitous routing of clock line 118, which is not uncommon. Each of muxed-scan cells 101-A and 101-B has a scan enable terminal connected to a global scan enable line 114.

Muxed-scan cell 201 (FIG. 2A) is a more detailed illustration of muxed-scan cells 101-A and 101-B. Data input terminal DI and scan input terminal SI are connected to first and second input terminals of multiplexer 202, respectively. The control terminal of multiplexer 202 is connected to scan enable terminal SE and output line of multiplexer 202 is connected to data input terminal D of D-type flip-flop 203. Output terminal Q of D-type flip-flop 203 is connected to data output terminal DQ of muxed-scan cell 201. Clock terminal CLK of D-type flip-flop 203 is connected to clock terminal CLK of muxed-scan cell 201.

Muxed-scan cell 201 operates in two modes, system mode and scan mode. In system mode, the signal on scan enable terminal SE is held inactive, e.g., tied to ground. Consequently, the signal on data input terminal DI is applied to data input terminal D of D-type flip-flop 203, and clocked into D-type flip-flop 203 by an active edge on terminal CLK. Consequently, in system mode, muxed-scan cell 201 simply functions as a D-type flip-flop. D-type flip-flop 203 works in a conventional manner, and has set-up and hold-time requirements for the signal on input terminal D. As is known to one of skill in the art, the set-up and hold-time requirements are defined with respect to an active edge on clock terminal CLK.

In scan mode, the signal on scan enable terminal SE is driven active so that the signal on scan input terminal SI is passed through multiplexer 202 to data input terminal D of D-type flip-flop 203. Consequently, an active edge on terminal CLK loads the signal on scan input terminal into D-type flip-flop 203 so that the signal is applied to output terminal DQ and in turn to the logic block. This provides controllability. When the signal on scan enable terminal SE is driven inactive, the signal on data input terminal DI from a logic block is passed through multiplexer 202 and is captured in D-type flip-flop 203. This provides observability. Notice that output terminal DQ is used for both the system and scan modes of operation.

While muxed-scan cell 201 requires only an addition of a multiplexer 201 to a D-type flip-flop 203, the interconnection of muxed-scan cells to form a scan chain can result in degradation of the performance of integrated circuit 100 in a system mode, i.e., when the signal on scan enable terminal SE is inactive, and in addition, the scan chain may not function properly in scan mode.

Since output pin DQ of each muxed-scan cell, e.g., cell 101-A, is used for both system and scan modes, output pin DQ of cell 101-A drives both scan input line 116 and data input line 117. When as in FIG. 1, scan input line 116 is considerably longer than data input line 117, scan input line 116 introduces a large capacitance load on output pin DQ. This capacitance is present in system mode, and can cause degradation of the muxed-scan cell's output signal. Specifically, the output signal can only rise in proportion to the charging of the line capacitance. Since the line capacitance is large, the timing performance is degraded. The timing problems introduced by the capacitance of the scan-input lines are particularly problematic for deep submicron designs, which are dominated by wires.

Another problem introduced by scan input line 116 is that when the data signal on line 110 changes state and is clocked through muxed-scan cell 101-A onto line 117, the signal level also changes on line 116. Thus, the dynamic power dissipation in the system mode is determined not only by the logic circuitry and associated interconnect lines, but also by the total capacitance of the scan input lines of the scan chain. However, in the system mode the scan-input lines have no function, and so the dynamic power consumption of these lines is another parasitic load that must be considered. Thus, the inclusion of a scan chain in an integrated circuit increases the dynamic power requirements in the system mode of operation.

Yet another problem arises in the scan mode. When as illustrated in FIG. 1, scan input line 116 is short relative to clock line 118, the capacitance of clock line 118 is considerably greater than the capacitance of scan input line 116. Consequently, an active clock edge 211 (FIG. 2B) may delayed in reaching terminal CLK of muxed-scan cell 101-B relative to the data signal reaching scan in terminal SI. If the signal (FIG. 2B) on scan in terminal SI of cell 101-B is not stable for hold-time tHOLD after clock edge 211 reaches terminal CLK of cell 101-B, a hold-time violation occurs. As shown in FIG. 2B, the signal on terminal SI falls to zero, prior to the end of hold-time tHOLD. Consequently, the state of the D-type flip-flop in cell 101-B is unknown as a result of the hold-time violation.

Unfortunately, the hold-time violation typically cannot be detected until after the layout is completed. This is considered one of the biggest drawbacks of a scan-chain that utilizes muxed-scan cells.

Hence, while the use of muxed-scan cells in a scan chain enhances the testability and fault coverage of an integrated circuit, these advantages can be obtained only if one is willing to accept the associated penalties. The timing performance is degraded and the dynamic power consumption increased in system mode. In scan mode, hold-time violations can defeat the proper functioning of the scan chain.

SUMMARY OF THE INVENTION

According to the principles of this invention, a low power scan cell overcomes the limitations of the prior art muxed-scan cell. When the low power scan cells are included in an integrated circuit, the low power scan cell of this invention eliminates parasitic dynamic power consumption associated with scan circuit lines as well as timing degradations in a system mode of operation. In addition, the low power scan cells of this invention minimize problems with hold-time violations during scan testing. Hence, the low power scan cells of this invention provide all the capability of the prior art muxed-scan cells without any of the associated disadvantages. Consequently, the low power scan cells of this invention can be used to enhance testability and fault coverage in an integrated circuit while the performance of the integrated circuit is enhanced relative to a similar integrated circuit that utilized the prior muxed-scan cells.

In one embodiment of the invention, an integrated circuit includes a lower power scan cell having a data input terminal, a data output terminal, a scan enable terminal, and a scan output terminal. A storage element in the scan cell has a storage element input terminal coupled to the data input terminal and a storage element output terminal coupled to the data output terminal. A propagation delay and isolation element in the scan cell has a first terminal connected to the scan enable terminal, a second terminal coupled to the storage element output terminal, and a third terminal connected to the scan output terminal. A multiplexer in the scan cell has a first input terminal connected to the scan cell data input terminal, a second input terminal connected to a scan input terminal, a control terminal connected to the scan enable terminal, and an output terminal connected to the storage element input terminal.

In one embodiment, the propagation delay and isolation element is an AND gate. The storage element is a D-type flip-flop.

This invention includes a method for enhancing performance of an integrated circuit that includes a scan chain comprised of a plurality of scan cells. The method includes:
  connecting only a data output terminal of a scan cell to a data input line of a logic circuit; and
  connecting an isolation element to the data output terminal of the scan cell, and to a scan input line wherein dynamic power consumption of the integrated circuit is optimized by isolating the scan input line from the data input line in a system mode of operation of the integrated circuit so that the scan input line does not contribute to the dynamic power consumption. The method of this invention also includes:
  selecting a propagation time delay for the isolation element so that an output signal from the scan cell is delayed, in reaching a scan input terminal of another scan cell, a time period that eliminates a hold-time violation.

BRIEF DESCRIPTION OF THE DRAWINGS

In the specification, elements with the same reference number are the same element. In addition, the first digit of a reference number for an element is the number of the Figure in which the element first appears.

DETAILED DESCRIPTION OF THE INVENTION

According to the principles of this invention, a portion of an integrated circuit 300 includes a plurality of logic blocks 320-A to 320-D and a portion of a scan chain that includes low power scan cell 301-A and low power scan cell 301-B of this invention. In a system mode of operation of integrated circuit 300, low power scan cell 301-A isolates scan input line 316 from data input line 317. Consequently in the system mode, the scan input lines in the scan chain neither dissipate power nor degrade the speed performance. In addition, as explained more completely below, in a scan mode of operation, low power scan cell 301-A delays the signal driven on scan input line 316 so that a hold-time violation is eliminated.

The low power scan cells of this invention eliminate the disadvantages of the prior art muxed-scan cells, while preserving the testability and fault coverage advantages of those cells. Consequently, integrated circuit 300 with the low power scan cells of this invention includes a scan capability to enhance testability and fault coverage and at the same time achieves a new level of performance with respect to both dynamic power consumption, and timing that was heretofore unavailable. In general, when the low power scan cells are utilized in an on-chip scan chain, the performance of the integrated circuit with respect to dynamic power consumption and timing in a system mode of operation, and with respect to minimization of hold-time violations in a scan mode of operation is enhanced relative to the same integrated circuit with a scan chain made up of prior art muxed-scan cells.

The functions performed by the plurality of logic blocks 320-A to 320-D and the interconnection of logic blocks 320-A to 320-D are not needed to understand the operation the low power scan cells of this invention and so are not considered further. A data output line 310 is connected to data input terminal DI of low power scan cell 301-A and data output terminal DQ is connected to logic block 320-A by data input line 317 that provides an input signal to logic block 320-A.

Figure 1:
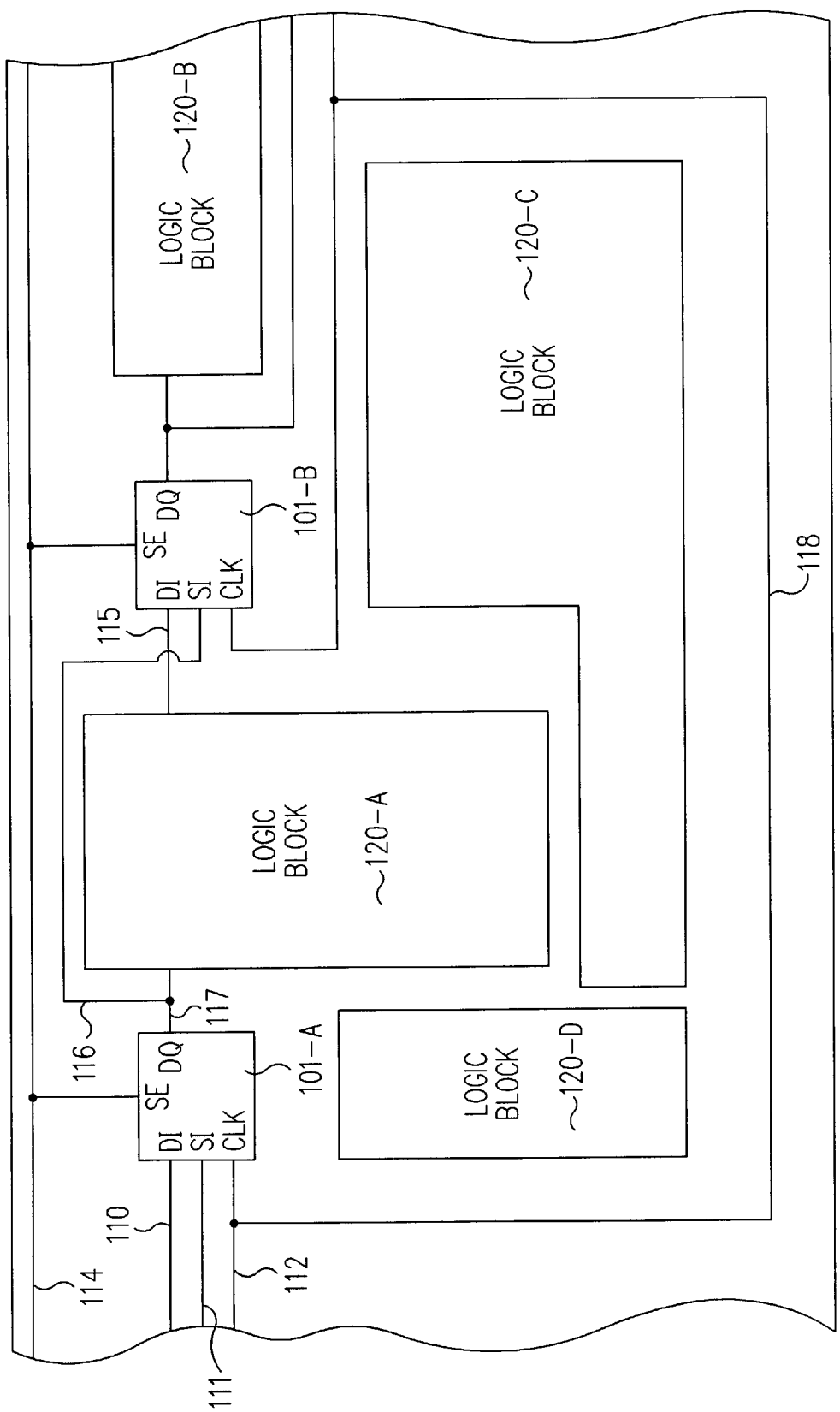
FIG. 1 is a block diagram of a portion of a prior art integrated circuit that includes muxed-scan cells.
Figure 2A:
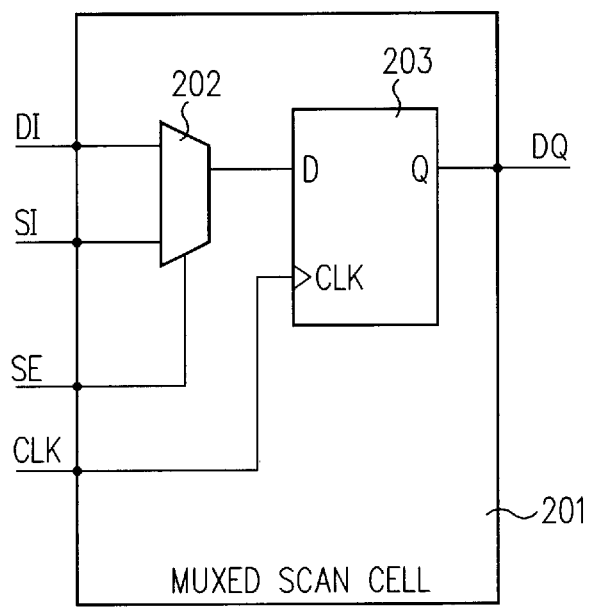
FIG. 2A is a diagram of a prior art muxed-scan cell.
Figure 2B:
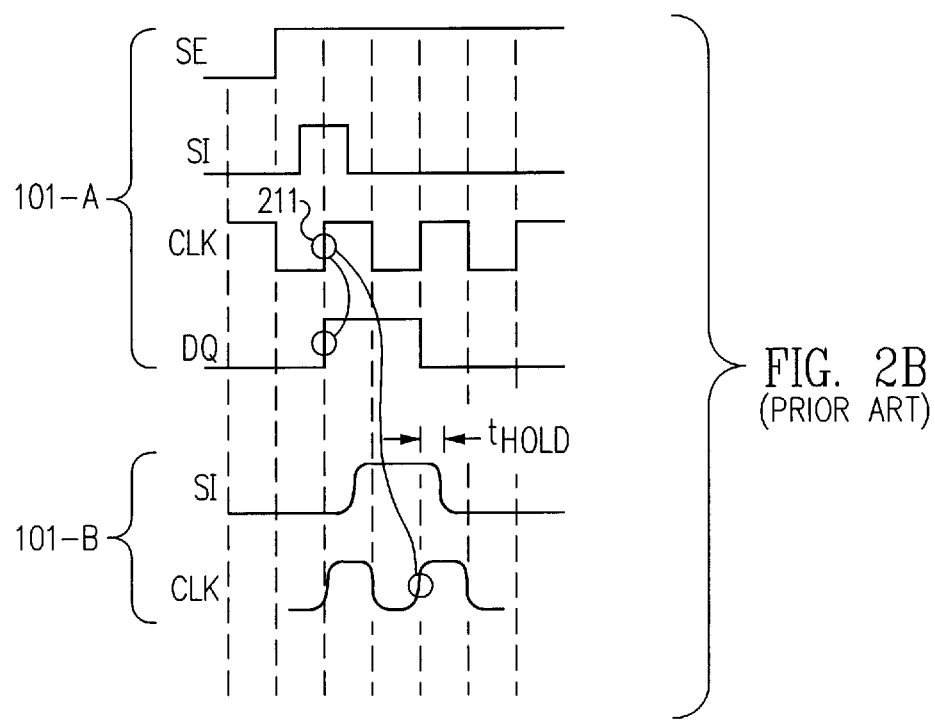
FIG. 2B is a timing diagram for the scan mode of the configuration illustrated in FIG. 1 that shows a hold-time violation caused by circuitous routing of a clock line relative to a scan input line.

Notice that unlike the prior art muxed-scan cell 101-A (FIG. 1), data output terminal DQ of cell 301-A is not connected to scan input line 316 that in turn is connected to scan input terminal SI of low power scan cell 301-B. Rather, low power scan cell 301-A has a scan output terminal SO connected to scan input line 316. As explained more completely below, in a system mode of operation, scan output terminal SO is isolated from data output terminal DQ.

Consequently, the characteristics of scan input line 316, and the other scan-input lines in the scan chain have no effect on the performance of integrated circuit 300 in the system mode of operation. Therefore, the scan-input lines neither dissipate power or degrade timing performance in the system mode of operation. Data input terminal DI of low power scan cell 201-B is connected to a data output line of logic block 120-A.

A clock line 312 is connected to clock terminal CLK of low power scan cell 301-A. The clock signal on clock line 312 is provided to clock terminal CLK of low power scan cell 301-B by clock line 318. Notice that in this example, the layout of logic blocks 320-A to 320-D also requires a somewhat circuitous routing of clock line 318. Each of low power scan cells 301-A and 301-B has a scan enable terminal connected to a scan enable line 314.

Figure 4A:
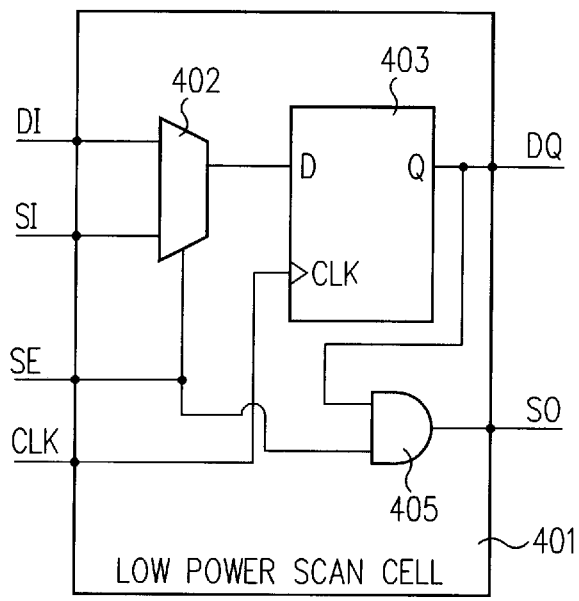
FIG. 4A is a diagram of one embodiment of the low power scan cell of this invention.

Low power scan cell 401 in FIG. 4A is illustrative of one embodiment of low power scan cells 301-A and 301-B. Data input terminal DI and scan input terminal SI are connected to first and second input terminals of multiplexer 402. The control terminal of multiplexer 402 is connected to scan enable terminal SE and the output line of multiplexer 402 is connected to data input terminal D of D-type flip-flop 403. Output terminal Q of D-type flip-flop 403 is connected to data output terminal DQ of low power scan cell 401. Output terminal Q is also connected to a first input terminal of an AND gate 405, e.g., an isolation gate. A second input terminal of AND gate 405 is connected to scan enable terminal SE. An output terminal of AND gate 405 is connected to scan output terminal SO. Clock terminal CLK of D-type flip-flop 403 is connected to clock terminal CLK of low power scan cell 401. Use of D-type flip-flop 403 in low power scan cell 401 is illustrative only of one embodiment of a storage element and is not intended to limit the invention to this particular type of storage element. In view of this disclosure, those of skill in the art can incorporate any storage element of interest with low power scan cell 401.

Low power scan cell 401 operates in two modes, system mode and scan mode. In system mode, the signal on scan enable terminal SE is held inactive, e.g., tied to ground. Thus, any signal on data input terminal DI is passed through multiplexer 402 to data input terminal D of D-type flip-flop 403, and clocked into D-type flip-flop 403 by an active edge on terminal CLK. D-type flip-flop 403 works in a conventional manner.

In system mode, the inactive signal on scan enable terminal SE causes AND gate 405 to hold scan out terminal SO at a low level irrespective of the signal level on either data input terminal DI, or data output terminal DQ. Consequently, in system mode, low power scan cell 401 simply functions as a D-type flip-flop, and scan output terminal SO is isolated from both data input terminal DI and data output terminal DQ.

Figure 4B:
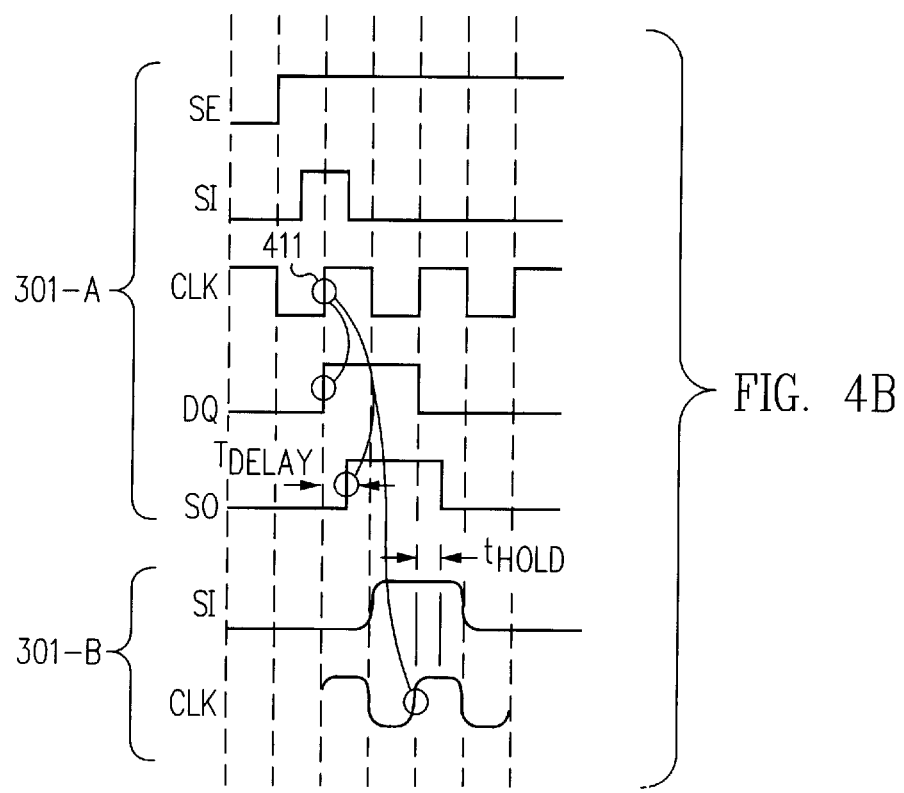
FIG. 4B is a timing diagram for the scan mode of the configuration illustrated in FIG. 4A that shows that a hold-time violation is not caused by circuitous routing of a clock line relative to a scan input line because a propagation delay and isolation element in a first low power scan cell of this invention delayed the signal on a scan input terminal of a second low power scan cell.

In scan mode, the signal on scan enable terminal SE is driven active (FIG. 4B) so that the signal on scan input terminal SI is passed through multiplexer 402 to data input terminal D of D-type flip-flop 403. Consequently, an active edge on terminal CLK loads the signal on scan input terminal SI into the D-type flip-flop so that the signal is applied to output terminal DQ and in turn to the logic block. This provides controllability. In addition, the active signal on scan enable terminal SE causes the output signal from AND gate 405 on scan out terminal SO to follow the signal on data output terminal DQ. However, the signal on data output terminal DQ is delayed by a time required for the signal to propagate through AND gate 405, i.e., time period tDELAY, so that the signal on data output terminal DQ arrives at scan output terminal SO after a predefined delay tDELAY. Predefined delay tDELAY is determined by the size of AND gate 405.

Hence, the size of the AND gate in cell 301-A is selected to compensate for any hold-time violation that previously would have been introduced by the delay of a clock signal edge 411 caused by the capacitance of clock line 318. Consequently, the signal on scan input line 316 to scan input terminal SI of low power cell 301-B has a timing relative to the clock signal on clock line 318 to terminal CLK of low power cell 301-B such that there is no hold-time violation for the D-type flip-flop in low power scan cell 301-B.

In this embodiment, the isolation element has a predefined signal propagation delay that is selected to eliminate hold-time violations. An isolation element with a predefined signal propagation delay is referred to as a propagation delay and isolation element. While in this embodiment, the propagation delay and isolation element is an AND gate, this is illustrative only of one embodiment of the invention and is not intended to limit the invention to this particular logic gate. In view of this disclosure, the propagation delay and isolation element could be implemented using other logic gates, a three-state driver with the control terminal connected to scan enable terminal SE, or perhaps a flow-through latch with a latch enable terminal connected to scan enable terminal SE. The particular embodiment chosen depends upon the silicon size limitations, and power limitations as well as the drive required for the scan-input lines.

When the signal on scan enable terminal SE is driven inactive in the scan mode, the signal on data input terminal DI from a logic block is passed through multiplexer 402 and is captured in D-type flip-flop 403. This provides observability. The inactive signal on scan enable terminal SE causes AND gate 405 to hold scan out terminal SO low during this phase of the scan mode. Hence, in this embodiment, low power scan cell 201 requires only an addition of an AND gate to the prior art muxed-scan cell.

Figure 3:
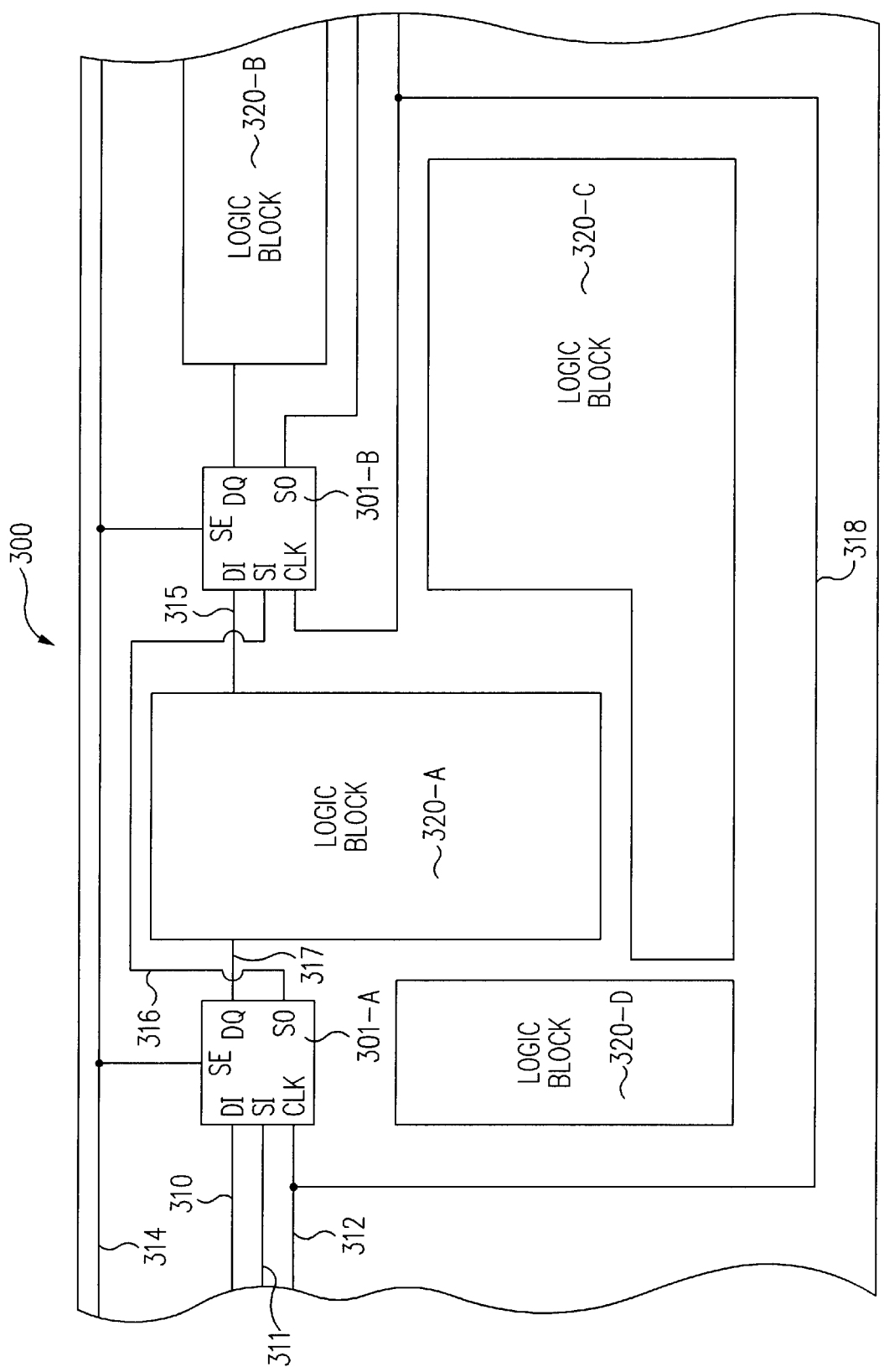
FIG. 3 is a block diagram of a portion of an integrated circuit that includes the low power scan cells of this invention.

Since scan output terminal SO is isolated from data output terminal DQ, the interconnection of the low power scan cells of this invention to form a scan chain no longer results in degradation of the performance of integrated circuit 300 in a system mode, i.e., when the signal on scan enable terminal SE is inactive. Output pin DQ of each low power scan cell, e.g., cell 301-A, drives only a data input line 117. Consequently, even when as in FIG. 3, scan input line 316 is considerably longer than data input line 317, the capacitance of scan input line 316 does not load data output terminal DQ. Therefore, the capacitance of scan input line 316 has no effect on the output signal on output terminal DQ in system mode. Hence, in system mode, the timing problems associated with the capacitance of the scan input lines are not a factor even for deep submicron designs which are dominated by wires.

Similarly, as indicated above, in system mode, scan input line 316 does not contribute to the dynamic power consumption. Thus, the dynamic power dissipation in the system mode is determined only by the logic circuitry and associated interconnect lines, and there is no contribution from the scan input lines of the scan chain. This decreases the dynamic power consumption of integrated circuit 300 relative to integrated circuit 100(assuming the two integrated circuits are the same except for the implementation of the scan cells) and so enhances the dynamic power performance of integrated circuit 300.

Hence, the use of low power scan cells in a scan chain not only enhances the testability and fault coverage of an integrated circuit, but also the timing performance and the dynamic power consumption in the system mode are no longer affected by the lower power scan cells. Moreover, in scan mode, hold-time violations can no longer defeat the functioning of the scan chain.

The embodiments of the low power scan cell described herein are only illustrative and are not intended to limit the invention to the specific embodiments disclosed. Also, in view of the above disclosure, those of skill in the art can implement the invention in a wide variety of applications that require a low power scan cell that has the performance characteristics of the scan cell of this invention.

In scan mode, the signal on scan enable terminal SE is driven active (FIG. 4B) so that the signal on scan input terminal SI is passed through multiplexer 402 to data input terminal D of D-type flip-flop 403. Consequently, an active edge on terminal CLK loads the signal on scan input terminal SI into the D-type flip-flop so that the signal is applied to output terminal DQ and in turn to the logic block. This provides controllability. In addition, the active signal on scan enable terminal SE causes the output signal from AND gate 405 on scan out terminal SO to follow the signal on data output terminal DQ. However, the signal on data output terminal DQ is delayed by a time required for the signal to propagate through AND gate 405, i.e., time period tDELAY, so that the signal on data output terminal DQ arrives at scan output terminal SO after a predefined delay tDELAY. Predefined delay tDELAY is determined by the size of AND gate 405.

I claim:

1. In an integrated circuit, a scan cell comprising:
   a data input terminal;
   a data output terminal;
   a scan enable terminal;
   a scan output terminal;
   a storage element having a storage element input terminal coupled to said data input terminal; and a storage element output terminal coupled to said data output terminal; and
   a propagation delay and isolation element having a first terminal connected to said scan enable terminal; a second terminal coupled to said storage element output terminal; and a third terminal connected to said scan output terminal.

2. The scan cell of claim 1 further comprising:
   a multiplexer having a first input terminal connected to said data input terminal of said scan cell;
   a second input terminal connected to a scan input terminal; a control terminal connected to said scan enable terminal; and an output terminal connected to said storage element input terminal.

3. The scan cell of claim 2 wherein said propagation delay and isolation element comprises an AND gate.

4. The scan cell of claim 1 wherein said propagation delay and isolation element comprises an AND gate.

5. The scan cell of claim 1 wherein said storage element is a D-type flip-flop.

6. The scan cell of claim 2 wherein said storage element is a D-type flip-flop.

7. The scan cell of claim 3 wherein said storage element is a D-type flip-flop.

8. In an integrated circuit, a scan cell comprising:
   a data input terminal;
   a data output terminal;
   a scan enable terminal;
   a scan output terminal;
   a clock input terminal;
   a multiplexer having a first input terminal connected to said data input terminal; a second input terminal connected to a scan input terminal; a control terminal connected to said scan enable terminal; and a multiplexer output terminal;
   a D-type flip-flop element having a data input terminal connect to said multiplexer output terminal; a clock terminal connected to said clock input terminal; and a data output terminal connected to said data output terminal of said scan cell; and
   an AND gate having a first terminal connected to said scan enable terminal; a second terminal coupled to said data output terminal of said D-type flip-flop; and an output terminal connected to said scan output terminal.

9. A method for enhancing performance of an integrated circuit that includes a scan chain comprised of a plurality of scan cells, said method comprising:
   connecting only a data output terminal of a scan cell to a data input line of a logic circuit; and
   connecting a first terminal of an isolation element to a scan enable terminal; a second terminal of said isolation element to a storage element output terminal; and a third terminal of said isolation element to a scan output terminal, wherein dynamic power consumption of said integrated circuit is optimized by isolating a scan input line from said data input line in a system mode of operation of said integrated circuit so that said scan input line does not contribute to said dynamic power consumption.

10. The method of claim 9 further comprising:
    selecting a propagation time delay for said isolation element so that an output signal from said scan cell is delayed, in reaching a scan input terminal of another scan cell, a time period that eliminates a hold-time violation.

* * * * *